United States Patent
Dixon et al.

(10) Patent No.: US 10,663,517 B2
(45) Date of Patent: May 26, 2020

(54) CONTROL SYSTEM FOR ELECTRIC MOTOR

(71) Applicant: TRW Limited, Solihull, West Midlands (GB)

(72) Inventors: Christopher David Dixon, Coventry (GB); Peter Geoffrey Scotson, Worcester (GB)

(73) Assignee: TRW Limited, Solihull, West Midlands ( * ) Notice: Subject to any disclaimer, the term of this patent is extended or adjusted under 35 U.S.C. 154(b) by 0 days.

(21) Appl. No.: 16/086,158

(22) PCT Filed: Mar. 17, 2017

(86) PCT No.: PCT/GB2017/050761
§ 371 (c)(1),
(2) Date: Sep. 18, 2018

(87) PCT Pub. No.: WO2017/158386
PCT Pub. Date: Sep. 21, 2017

(65) Prior Publication Data
US 2019/0101594 A1 Apr. 4, 2019

(30) Foreign Application Priority Data
Mar. 18, 2016 (GB) .................................. 1604663.3

(51) Int. Cl.
*G01R 31/34* (2020.01)
*H02P 21/05* (2006.01)
(Continued)

(52) U.S. Cl.
CPC .............. *G01R 31/343* (2013.01); *H02P 6/10* (2013.01); *H02P 21/05* (2013.01); *H02P 29/0243* (2016.02); *H02P 29/50* (2016.02)

(58) Field of Classification Search
CPC .................................. H02P 6/10; G01R 31/343
(Continued)

(56) References Cited

U.S. PATENT DOCUMENTS

| 6,777,907 B2 * | 8/2004 | Ho ........................ H02P 21/22 318/432 |
| 7,791,309 B2 * | 9/2010 | Hwang ..................... H02P 1/30 318/430 |

(Continued)

FOREIGN PATENT DOCUMENTS

| CN | 104852661 A | 8/2015 |
| JP | 2003164198 A | 6/2003 |
| JP | 2011067044 A | 3/2011 |

OTHER PUBLICATIONS

Patents Act 1977: Search Report under Section 17(5), Application No. GB 1604663.3, dated Sep. 20, 2016.

(Continued)

*Primary Examiner* — David Luo
(74) *Attorney, Agent, or Firm* — MacMillian, Sobanski & Todd, LLC

(57) ABSTRACT

A control system for an electric motor comprises a current controller which produces a set of voltage demands for the motor, a current sensing means arranged to produce a current sensing output indicative of electric current in the motor, and a current signal processing means arranged to process the current sensing output signal to produce a modified current signal in which at least one harmonic component present in the current sensing output signal due to inaccuracies in the current measurement is removed or substantially reduced. The modified current signal is combined with a demanded motor current to provide the input to the current controller.

8 Claims, 3 Drawing Sheets

(51) Int. Cl.
   *H02P 29/024*  (2016.01)
   *H02P 29/50*   (2016.01)
   *H02P 6/10*    (2006.01)
(58) Field of Classification Search
   USPC .................................................. 318/629, 560
   See application file for complete search history.

(56) References Cited

U.S. PATENT DOCUMENTS

| | | | |
|---|---|---|---|
| 8,749,183 B2* | 6/2014 | Bonvin | G11B 19/20 |
| | | | 318/400.3 |
| 9,372,234 B2* | 6/2016 | Wang | G01R 31/3191 |
| 2003/0001536 A1 | 1/2003 | Kitajima | |
| 2003/0090232 A1 | 5/2003 | Ho | |
| 2013/0106332 A1 | 5/2013 | Williams et al. | |
| 2013/0193898 A1 | 8/2013 | Williams et al. | |

OTHER PUBLICATIONS

PCT International Search Report and the Written Opinion, Application No. PCT/GB2017/050761 filed Mar. 17, 2017, dated Jun. 26, 2017.

\* cited by examiner

CONTROL SYSTEM FOR ELECTRIC MOTOR

CROSS-REFERENCE TO RELATED APPLICATIONS

This application is a national stage of International Application No. PCT/GB2017/050761, filed 17 Mar. 2017, the disclosures of which are incorporated herein by reference in entirety, and which claimed priority to Great Britain Patent Application No. 1604663.3, filed 18 Mar. 2016, the disclosures of which are incorporated herein by reference in entirety.

BACKGROUND TO THE INVENTION

The present invention relates to a control system for an electric motor, and in particular to measurement of current in electric motors and the control of electric motors based on current measurement.

A closed loop current controller for an electric actuator typically takes the form shown in FIG. 1, where, using vector control, a demand voltage VDQ is applied to each phase winding of a motor 10 and the resultant generated currents, iMotor, measured by a current measurement circuit. The measured currents are then used by a current controller 20, typically a PI controller, to control the motor currents to the requested target current. The input to the PI controller is the difference between the target demand current iDQ and the actual measured current. The output of the controller is typically a set of motor demand voltages that are used to determine PWM waveforms that are applied to the drive bridge switches of a motor drive circuit. A signal which gives the electrical position of the motor is also required so that the voltages can be applied at the correct phases at the correct times. In the system of FIG. 1 a position sensor is shown but the present invention is equally applicable to a position sensorless system, where the position signal is estimated from other sensor measurements.

Due to inaccuracies and limitations of the current sensor the measurement process can introduce harmonics into the output signal of the current sensor that are not present in the currents that are being measured. The current controller then reacts to these harmonics in the sensor output to try to remove them, but their removal by the current controller, to give a smooth output from the current sensor, causes the actual currents to contain these harmonics.

Depending on the frequency and amplitude of these unwanted harmonics the torque produced by the motor can be degraded, with the harmonics potentially causing torque ripple and/or acoustic noise.

Typically two methods of phase current measurement are employed:

1. Phase current sensors, where a current measurement device is placed in each of the phases. (For a three phase system it may be that only 2 phases are measured as the $3^{rd}$ phase can be calculated from the 2 measured phases).

2. Single current sensor, where the current flowing in the DC link is measured at specific points during the PWM duty cycle to allow the current in the 3 phases to be calculated.

FIG. 3 shows the use of a single current sensor 30 on a three phase motor 10. Also shown in this figure are the bridge switches that are opened and closed according to a PWM pattern set by the voltage demand signal.

The harmonics introduced will be different, depending on the phase current measurement method used. The present invention is applicable to any harmonic introduced by measurement inaccuracies.

SUMMARY OF THE INVENTION

According to a first aspect the present invention provides a control system for an electric motor, the system comprising a current controller which produces a set of voltage demands for the motor, a current sensing means arranged to produce a current sensing output indicative of electric current in the motor, current signal processing means arranged to process the current sensing output signal to produce a modified current signal in which at least one harmonic component present in the current sensing output signal due to inaccuracies in the current measurement is removed or substantially reduced, and in which the modified current signal is combined with a demanded motor current to provide the input to the controller.

The current sensing means may be arranged in a first step to isolate the harmonic, and in a second step to compensate for the harmonic by subtracting the isolated harmonic from the current output signal to produce the modified current signal.

The current sensing means may be arranged to output a current signal in a frame of reference which is stationary, which may be the frame of reference of the windings and defined, for example, as a and 0 components, or in a rotating frame of reference, which may be the frame of reference of the rotor, and defined, for example, as D and Q axis components. The latter is preferred.

Where the current output signal is in the DQ frame, the current signal processing means may perform the isolation step by first passing the current output signal through a first filter to remove the DC component of the signal and to pass the harmonic and any other frequencies, then transform the filtered signal into an intermediate signal in a frame of reference in which the harmonic component is a DC component, then pass the intermediate signal through a second filter to leave only the DC component, then apply a reverse transform to shift the remaining DC component back to its original harmonic frequency.

The current output signal may separately isolate positive and negative harmonics using the steps listed above for each one. Both the positive and negative harmonics may then be subtracted from the current sensor output signal.

The first filter may comprise a high pass filter that removes the DC offset, passing through the harmonic frequencies (as well as other frequencies).

The second filter may comprise a low pass filter can be used to isolate the required harmonic (which is now the DC component).

The current signal processing means may include a synchronous filter that is arranged to transform the filtered signal to the isolation frequency reference frame.

The synchronous filter may be of the form:

$$y(t) = e^{jh\theta}u(t) = \begin{bmatrix} \cos(h\theta) & \sin(h\theta) \\ -\sin(h\theta) & \cos(h\theta) \end{bmatrix} u(t)$$

where h is the harmonic frequency, u(t) is the input to the filter, y(t) is the output, and θ is the electrical position of the motor.

Similarly a further synchronous filter may be provided that performs the reverse transforms.

The controller may comprise a PI controller.

The motor may comprise a three phase motor, and the current sensing means may comprise a single current sensor. The controller may be arranged to generate PWM voltage demand signals for the motor that include measurement times within the PWM periods that permit the current in each of the three phases to be determined from the output of the current sensor. These times will typically correspond to a first period of time when it is known that the current flowing through the current sensor is equal to the current in one of the phases and a second period of time in which the current flowing through the current sensor device is equal to the current flowing in a different one of the phases. The current in the third phase can then be determined easily as the sum of the currents flowing in the motor must be equal to zero.

Alternatively, the current sensing means may comprise a plurality of current sensors. For a three phase motor, there may be three current sensors. This allows the current in all three phases to be measured at once, removing the need for the special measurement times in each period.

The motor may have stationary windings and a rotor which rotates relative to the windings. The current sensing means may comprise a current sensor arranged to measure current in the motor windings. The current may be measured as two components in the frame of reference of the windings. The current sensing means may comprise transformation means arranged to transform the measured current into the frame of reference of the rotor, for example as torque-generating and non-torque-generating components.

The control system may be arranged to correct a plurality of components of harmonic distortion. For example the components of distortion may be harmonics having different frequencies and/or different signs, or may be at different positive frequencies/different negative frequencies.

Other advantages of this invention will become apparent to those skilled in the art from the following detailed description of the preferred embodiments, when read in light of the accompanying drawings.

DETAILED DESCRIPTION OF THE INVENTION

Figure 1:
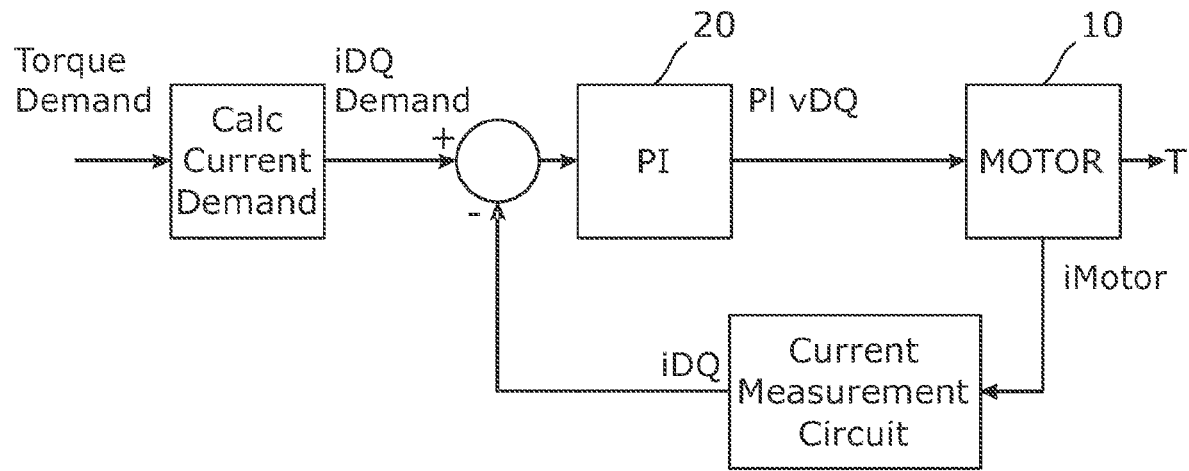
FIG. 1 is a diagram of a known closed loop current control system for a motor.
Figure 2:
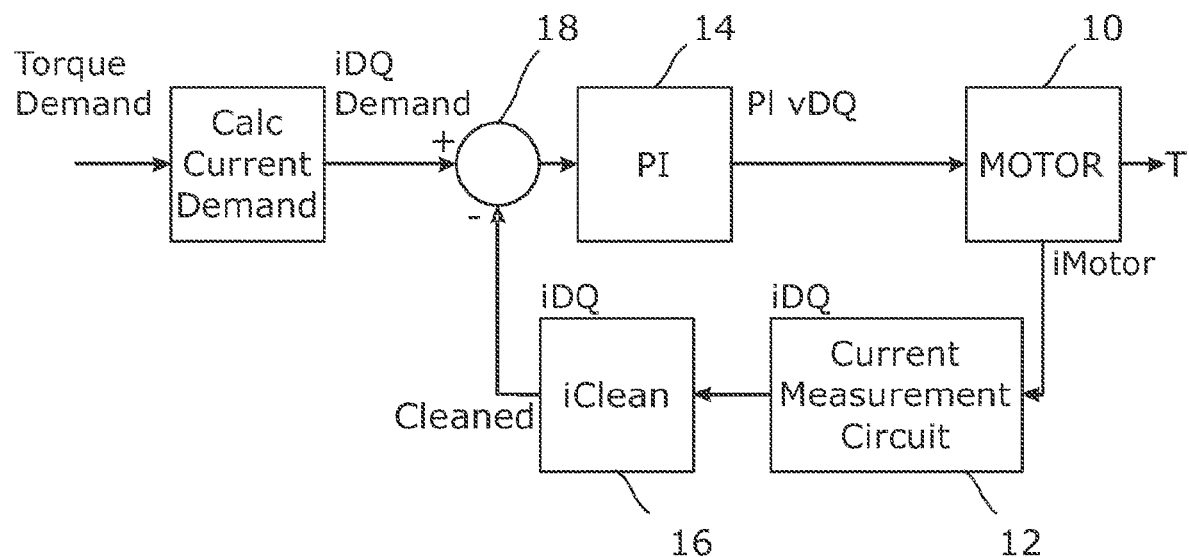
FIG. 2 is a diagram of a closed loop current control system for a motor according to an embodiment of the invention.

Referring to FIG. 2 the motor 10 is controlled by a closed loop motor current control system according to an embodiment of the invention comprises a current sensing system 12 and a current controller 14. The current sensing system 12 comprises a current sensor arranged to measure the currents $i_A$, $i_B$, $i_C$ in the three phases of the motor, which comprise stationary windings, and output a signal indicative of the current vector in the stationary coordinates having α and β components. The current sensing system further comprises a coordinate transformation circuit arranged to convert the current vector from the α and β components in the stationary reference from, to D and Q components $i_D$ and $i_Q$ defining the current vector in the rotor reference frame, which rotates relative to the fixed windings, with the Q axis current being the torque generating component and the D axis current being non-torque-generating.

Figure 3:
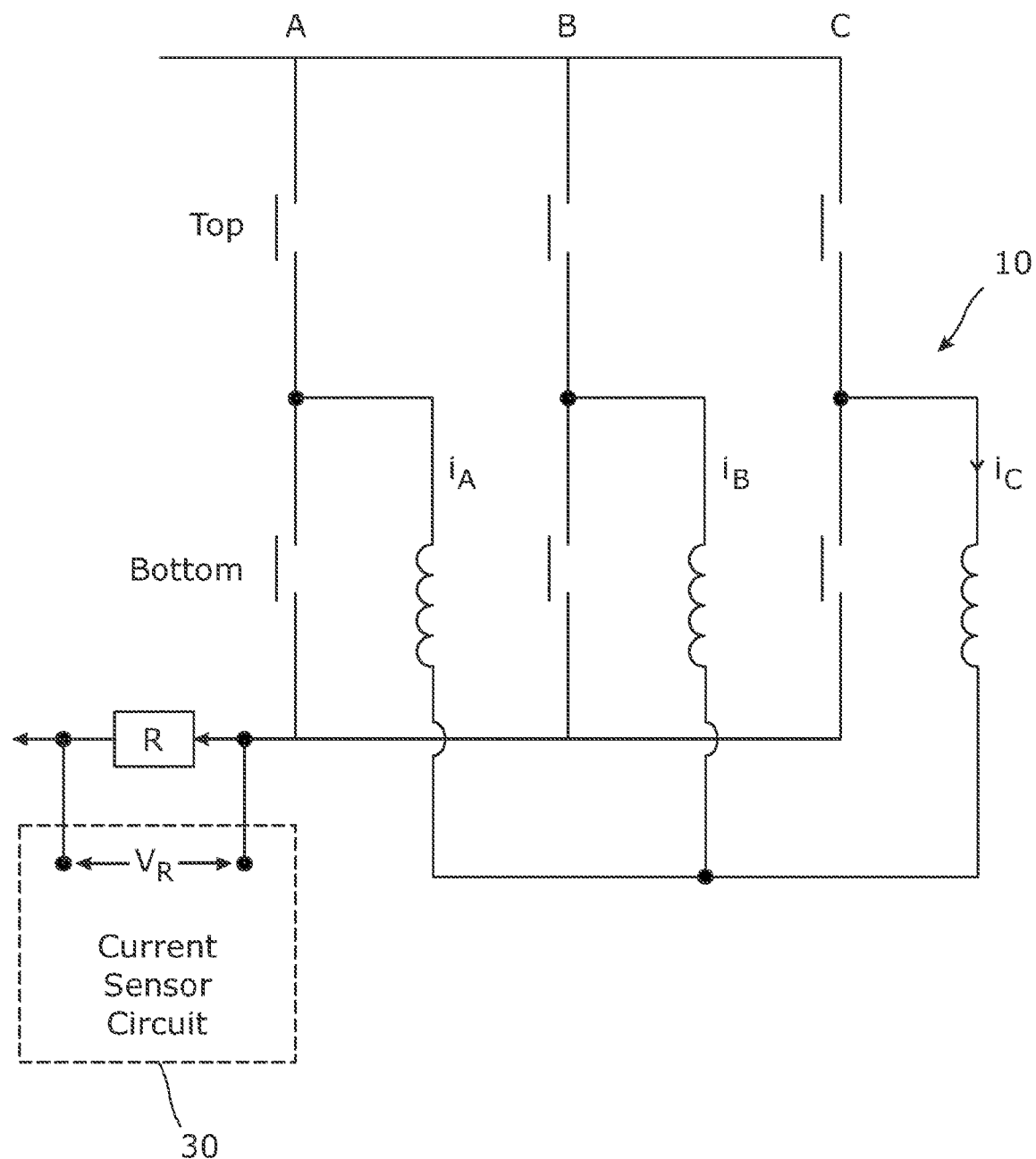
FIG. 3 shows the location of a single current sensor when used with a three phase PWM controlled motor.

The current controller 14 receives the current error—which as will be explained below has been cleaned to remove any harmonic components introduced as a measurement error by the current sensing means 12, and outputs a demanded voltage vector, in the form of a D and Q axis voltage demand VDQ calculated to reduce the current error so that the measured current vector approaches the demanded current vector. A further transformation circuit (not shown) receives the voltage demand from the current controller and converts it to α and β components $V_{\alpha\beta}$ which are input to a PWM driver (also not shown) which is arranged to control a number of switches to apply voltages to the phase windings of the motor in a PWM pattern which produces the net voltage in the windings having a magnitude and direction corresponding to the voltage demand vector. The switches may be arranged in a bridge with a top and bottom switch for each motor phase as shown in FIG. 3.

The current sensor in this system produces harmonic interferences because it is imperfect. Primarily these occur because the current sensor takes time to settle and the time window for taking the measurement is too short for the sensor to fully settle.

The control system includes a current cleaning circuit, iClean, 16, that is arranged provide a harmonic compensation function. The compensation process that the control system is arranged to perform can be broken down into two stages: isolation of harmonics and subtraction of harmonics. Each stage may be duplicated to allow both positive and negative harmonic frequencies to be removed. The circuit is shown in detail in FIG. 4. Only the stages for the positive harmonic will be described here as the stages are functionally the same. Like reference numerals will therefore be used for parts of the circuit that deal with the positive and the negative harmonics.

In a first stage, to isolate the harmonics, the current output signal in the DQ frame is first filtered by passing it through a high pass filter 22. This removes the DC component and leaves the non-DC frequencies which will include the harmonic of interest. To isolate the harmonics the current control system next uses a synchronous filter 24 that is arranged to transform the intermediate filtered signal to the isolation frequency reference frame. This allows the unwanted harmonic, which is in this case assumed to be a single harmonic of known frequency, to be isolated simply by shifting it to become a DC component.

Figure 4:
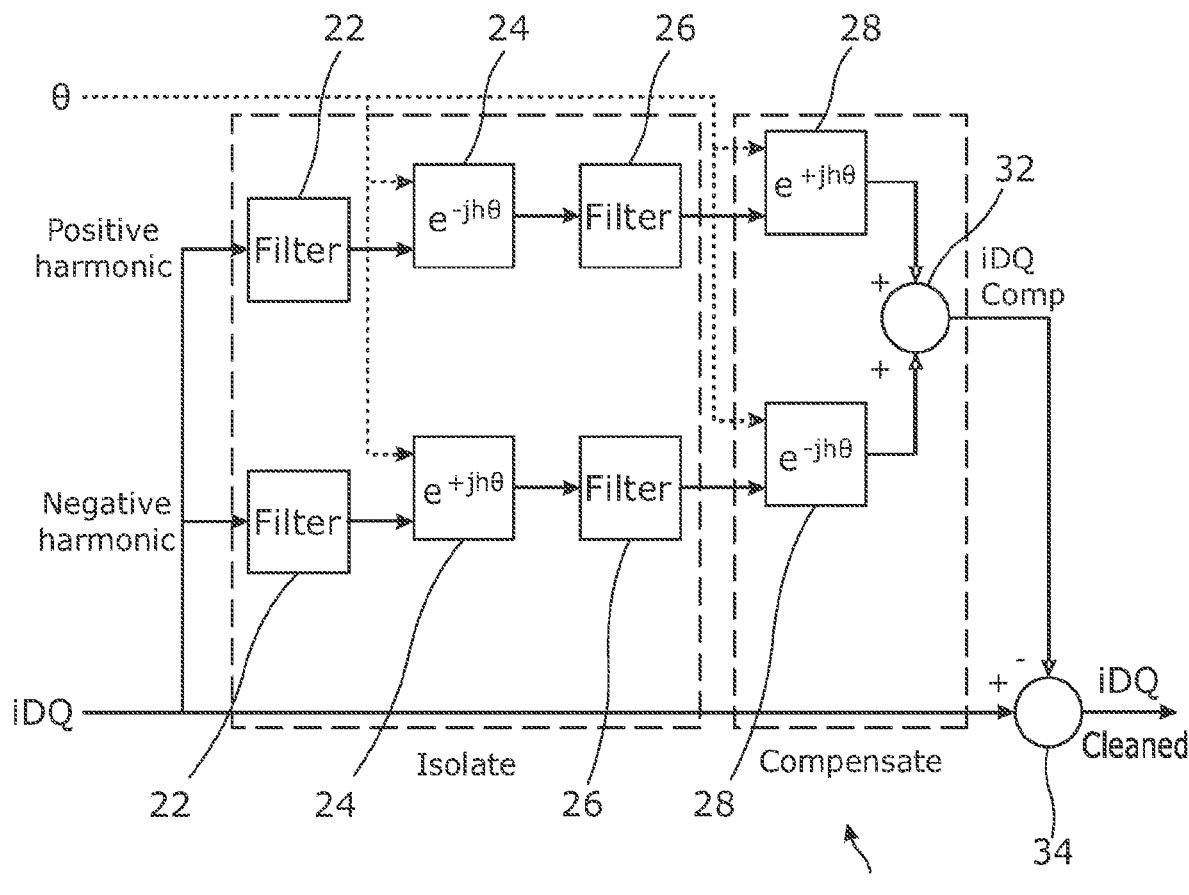
FIG. 4 is a diagram of a preferred current signal processing means (iClean) of the embodiment of FIG. 2.
Figure 5:
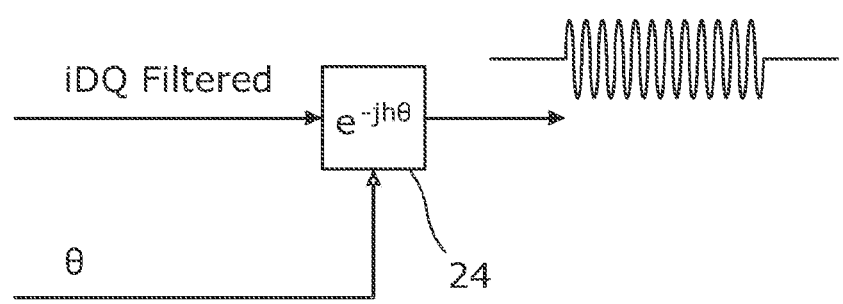
FIG. 5 is a diagram of a synchronous filter that can be used in the control system of FIG. 2.

FIG. 4 shows one implementation of a synchronous filter 24, which receives as inputs the filtered current sensor output signal, the motor electrical position θ and the harmonic h (relative to the motor electrical frequency) to be isolated. Note that h can be positive or negative depending on whether the targeted harmonic is a positive or negative sequence component (i.e. whether it travels in the same direction as the rotor or the opposite direction).

The transformation $e^{jh\theta}$ performed by the filter 24 is defined as:

$$y(t) = e^{jh\theta}u(t) = \begin{bmatrix} \cos(h\theta) & \sin(h\theta) \\ -\sin(h\theta) & \cos(h\theta) \end{bmatrix} u(t)$$

where u(t) is the input to the filter 24, y(t) is the output, and θ is the electrical position of the motor.

The transformed signal output by the synchronous filter 24 will contain DC and AC components. The AC components are caused by all of the other harmonics in the original signal. If the DC component is zero then the isolation frequency is not present in the current controller output voltages.

The transformed signal is then passed through a low pass filter 26 that removes all other unwanted frequencies and leaves the DC component.

This isolated DC component is then fed to a further synchronous filter 28 that performs a transformation which is the inverse of that performed by the synchronous filter to convert this DC correction to a sinusoidal correction signal equal to the unwanted harmonic.

The filtering/transformation is performed twice—once for positive harmonics and once for negative. The two isolated harmonics are the then fed into an adder 32 that adds them together and the resulting signal is then subtracted from the current sensor output signal in a combiner block 34. The result is that the harmonics are removed from the current sensor output signal.

A comparator 18 receives the cleaned current measurement signal D and Q currents and compares them with demanded D and Q current components to generate an error. This error is fed to the PI controller.

Because the harmonic errors have been removed there is no danger of them being applied to the voltage demand signal and being imposed onto the actual motor currents.

In accordance with the provisions of the patent statutes, the principle and mode of operation of this invention have been explained and illustrated in its preferred embodiments. However, it must be understood that this invention may be practiced otherwise than as specifically explained and illustrated without departing from its spirit or scope.

The invention claimed is:

1. A control system for an electric motor, the control system comprising: a current controller which produces a set of voltage demands for the electric motor, a current sensing means arranged to produce a current sensing output signal indicative of electric current in the electric motor, current signal processing means arranged to process the current sensing output signal to produce a modified current signal in which at least one harmonic component present in the current sensing output signal due to inaccuracies in the current processing is removed or substantially reduced, and in which the modified current signal is combined with a demanded motor current to provide an input to the current controller.

2. The control system according to claim 1 in which the current sensing means is arranged in a first step to isolate the at least one harmonic component, and in a second step to compensate for the at least one harmonic component by subtracting the isolated harmonic from the current sensing output signal to produce the modified current signal.

3. The control system according to claim 2 in which the current sensing means is arranged to output a current signal in a frame of reference of the electric motor as D and Q axis components.

4. The control system according to claim 3 in which the current signal processing means performs the isolation first step by first passing the current sensing output signal through a first filter to remove a DC component of the current sending output signal and to pass the harmonic and any other frequencies, then transforms the current sensing output signal passed through the first filter into an intermediate signal in a frame of reference in which the harmonic component is a DC component, then passes the intermediate signal through a second filter to leave only the DC component, then applies a reverse transform to shift the remaining DC component back to its original harmonic frequency.

5. The control system according to claim 4 in which the first filter comprises a high pass filter that removes the DC offset, passing through the harmonic frequencies.

6. The control system according to claim 4 in which the second filter comprises a low pass filter.

7. The control system according to claim 4 in which the current signal processing means includes a synchronous filter that is arranged to transform the current sensing output signal passed through the first filter to the isolation frequency reference frame.

8. The control system according to claim 1 which separately isolates positive and negative harmonics.

* * * * *